US010790218B2

(12) United States Patent
Ishibashi et al.

(10) Patent No.: US 10,790,218 B2
(45) Date of Patent: Sep. 29, 2020

(54) SEMICONDUCTOR DEVICE AND ELECTRIC POWER CONVERSION APPARATUS

(71) Applicant: Mitsubishi Electric Corporation, Tokyo (JP)

(72) Inventors: Hidetoshi Ishibashi, Tokyo (JP); Hiroshi Yoshida, Tokyo (JP); Daisuke Murata, Tokyo (JP); Takuya Kitabayashi, Tokyo (JP)

(73) Assignee: Mitsubishi Electric Corpration, Tokyo (JP)

( * ) Notice: Subject to any disclaimer, the term of this patent is extended or adjusted under 35 U.S.C. 154(b) by 0 days.

(21) Appl. No.: 16/404,992

(22) Filed: May 7, 2019

(65) Prior Publication Data

US 2020/0083146 A1 Mar. 12, 2020

(30) Foreign Application Priority Data

Sep. 6, 2018 (JP) .................................. 2018-166813

(51) Int. Cl.
*H01L 23/492* (2006.01)
*H01L 23/31* (2006.01)
(Continued)

(52) U.S. Cl.
CPC ........ *H01L 23/492* (2013.01); *H01L 23/3114* (2013.01); *H01L 24/83* (2013.01);
(Continued)

(58) Field of Classification Search
CPC ... H01L 23/053; H01L 23/24; H01L 23/3114; H01L 23/3121; H01L 23/492;
(Continued)

(56) References Cited

U.S. PATENT DOCUMENTS 9,431,326 B2 * 8/2016 Denta ................... H01L 23/495
2006/0060982 A1 * 3/2006 Ikawa ............... H01L 23/49861
257/779
(Continued)

FOREIGN PATENT DOCUMENTS

JP 2013021371 A * 1/2013
JP 2015-162649 A 9/2015
(Continued)

*Primary Examiner* — Allan R Wilson
(74) *Attorney, Agent, or Firm* — Studebaker & Brackett PC

(57) ABSTRACT

A semiconductor device according to the present invention includes a relay substrate provided on a plurality of semiconductor chips. The relay substrate includes an insulating plate in which a through hole is formed, a lower conductor provided on a lower surface of the insulating plate and having a first lower conductor and a second lower conductor, an upper conductor provided on an upper surface of the insulating plate, a connection part provided in the through hole and connecting the second lower conductor and the upper conductor together, and a protruding part which is a part of one of the first lower conductor and the upper conductor and protrudes outward from the insulating plate, the protruding part is connected to a first external electrode, and another of the first lower conductor and the upper conductor is connected to a second external electrode and is positioned inside the insulating plate.

8 Claims, 6 Drawing Sheets

(51) Int. Cl.
*H02M 7/217* (2006.01)
*H02M 3/335* (2006.01)
*H01L 23/00* (2006.01)

(52) U.S. Cl.
CPC ......... *H02M 3/335* (2013.01); *H02M 7/2173* (2013.01); *H01L 2224/83801* (2013.01)

(58) Field of Classification Search
CPC ...... H01L 24/83; H01L 25/072; H02M 3/335; H02M 7/2173
See application file for complete search history.

(56) References Cited

U.S. PATENT DOCUMENTS

| | | | |
|---|---|---|---|
| 2015/0262972 A1* | 9/2015 | Katkar | H01L 25/50 257/48 |
| 2016/0163650 A1* | 6/2016 | Gao | H01L 21/486 257/773 |
| 2017/0263545 A1* | 9/2017 | Tsukamoto | H01L 21/4857 |
| 2017/0271274 A1* | 9/2017 | Hinata | H01L 21/565 |
| 2017/0372978 A1 | 12/2017 | Oka et al. | |
| 2018/0294253 A1 | 10/2018 | Yoshida et al. | |

FOREIGN PATENT DOCUMENTS

| | | |
|---|---|---|
| JP | 2017-228694 A | 12/2017 |
| WO | 2017/130381 A1 | 8/2017 |

* cited by examiner

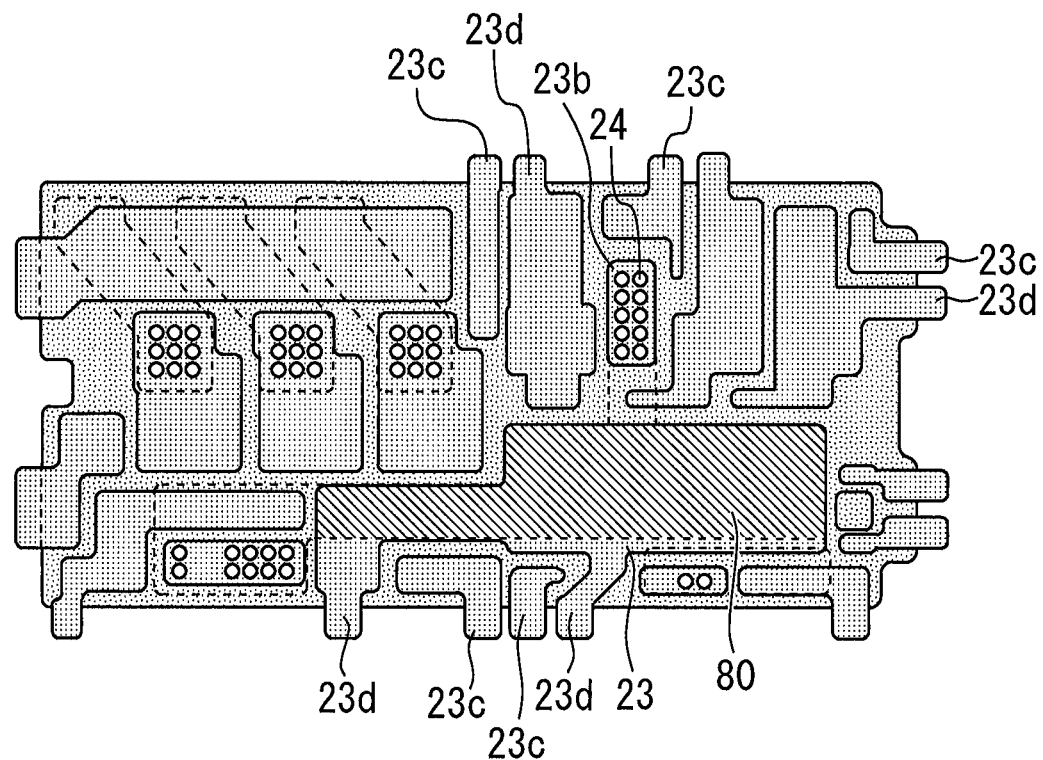
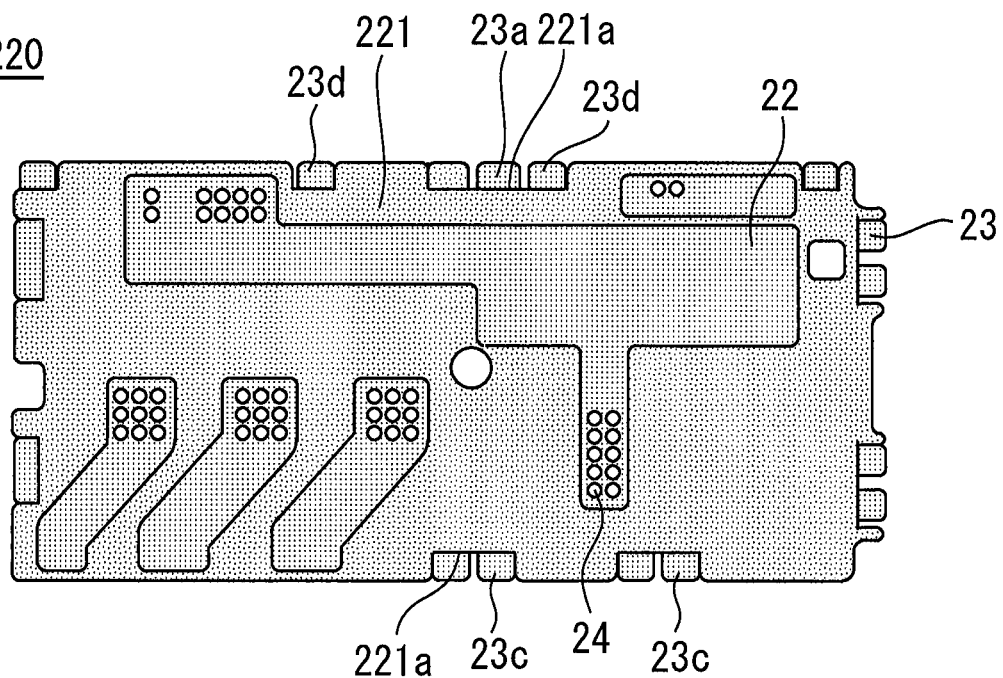

SEMICONDUCTOR DEVICE AND ELECTRIC POWER CONVERSION APPARATUS

BACKGROUND OF THE INVENTION

Field

The present invention relates to a semiconductor device and an electric power conversion apparatus.

Background

WO 2017/130381 discloses a semiconductor device including semiconductor chips fixed to a substrate, and an insulating plate. In this semiconductor device, a lower conductor formed on the lower surface of the insulating plate is soldered to the plurality of semiconductor chips. The lower conductor has a lower protruding part extending outward of the insulating plate. Moreover, an upper conductor formed on the upper surface of the insulating plate has an upper protruding part extending outward of the insulating plate. A first external electrode is connected to the lower protruding part, and a second external electrode is connected to the upper protruding part.

When, as presented in WO 2017/130381, the conductor parts pop out outward from both surfaces of a printed circuit board, there is a concern that workability is significantly impaired in performing router processing or V-cutting from both sides of the printed circuit board. Therefore, there is a possibility that such processing is difficult and accuracy of the processing is impaired. Moreover, since the conductor parts protrude from both sides of the printed circuit board, flexibility of designing may deteriorate.

SUMMARY

The present invention is devised in order to solve the aforementioned problems, and an object thereof is to obtain a semiconductor device and an electric power conversion apparatus which can be easily manufactured.

The features and advantages of the present invention may be summarized as follows.

According to the present invention, a semiconductor device includes a substrate, a plurality of semiconductor chips provided on the substrate, a relay substrate provided on the plurality of semiconductor chips, a first external electrode, and a second external electrode, wherein the relay substrate includes an insulating plate in which a through hole is formed, a lower conductor provided on a lower surface of the insulating plate and having a first lower conductor electrically connected to any of the plurality of semiconductor chips and a second lower conductor electrically connected to any of the plurality of semiconductor chips, an upper conductor provided on an upper surface of the insulating plate, a connection part provided in the through hole and electrically connecting the second lower conductor and the upper conductor together, and a protruding part which is a part of one of the first lower conductor and the upper conductor and protrudes outward from the insulating plate in plan view, the protruding part is electrically connected to the first external electrode, and the other of the first lower conductor and the upper conductor is electrically connected to the second external electrode and is positioned inside the insulating plate in plan view.

According to the present invention, a semiconductor device includes a substrate, a plurality of semiconductor chips provided on the substrate, a relay substrate provided on the plurality of semiconductor chips, a first external electrode, and a second external electrode, wherein the relay substrate includes an insulating plate in which a through hole is formed, a lower conductor provided on a lower surface of the insulating plate and having a first lower conductor and a second lower conductor each of which is electrically connected to any of the plurality of semiconductor chips, an upper conductor provided on an upper surface of the insulating plate, and a connection part provided in the through hole and electrically connecting the second lower conductor and the upper conductor together, a notch which exposes the first lower conductor is formed on an end part of the insulating plate, the first external electrode is electrically connected to a portion, of the first lower conductor, which is exposed from the notch, and the second external electrode is electrically connected to the upper conductor.

Other and further objects, features and advantages of the invention will appear more fully from the following description.

BRIEF DESCRIPTION OF DRAWINGS

FIG. 5 is a view having positions of upper conductors superimposed on the bottom view of the relay substrate according to the first embodiment.

FIG. 6 is a plan view of a relay substrate according to a second embodiment.

DESCRIPTION OF EMBODIMENTS

Figure 1:
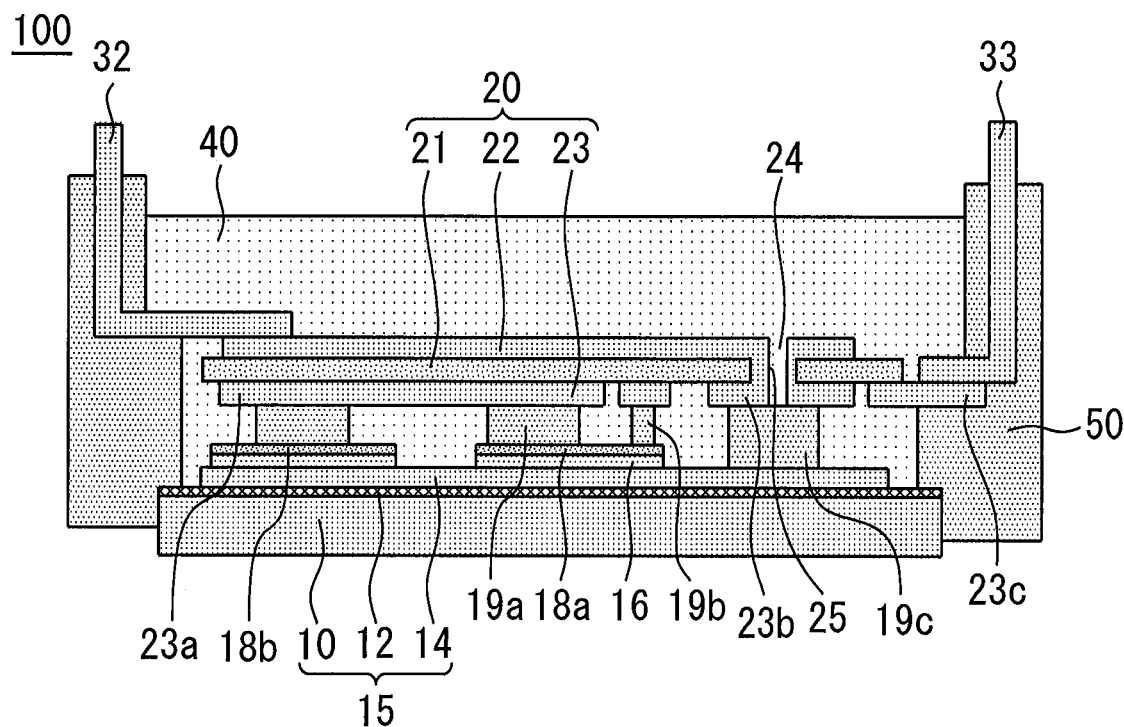
FIG. 1 is a cross-sectional view of a semiconductor device according to a first embodiment.

A semiconductor device and an electric power conversion apparatus according to an embodiment of the present invention will be described with reference to the accompanying drawings. Components identical or corresponding to each other are indicated by the same reference characters, and repeated description of them is avoided in some cases.

First Embodiment

Figure 2:
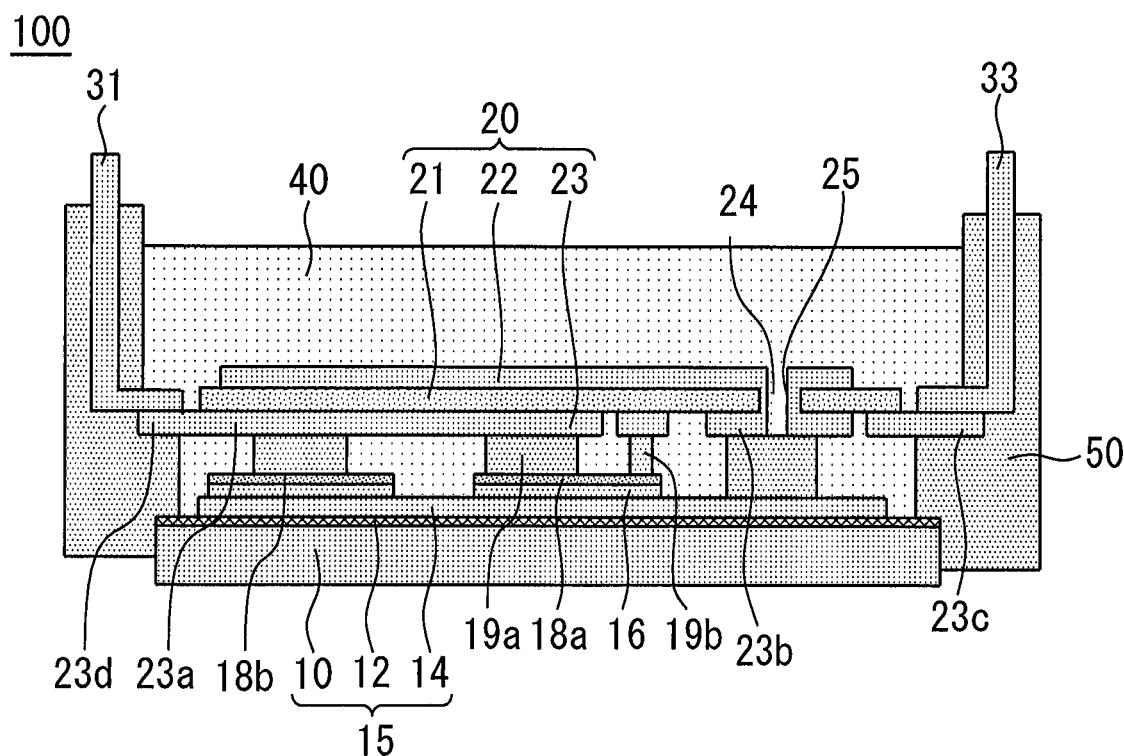
FIG. 2 is a cross-sectional view of the semiconductor device according to a first embodiment at a different position.

FIG. 1 is a cross-sectional view of a semiconductor device 100 according to a first embodiment. FIG. 2 is a cross-sectional view of the semiconductor device 100 according to a first embodiment at a different position. The semiconductor device 100 includes a substrate 15. The substrate 15 is an insulating substrate. The substrate 15 includes a base plate 10 formed of a metal. An insulating layer 12 is provided on the base plate 10. A circuit pattern 14 is provided on the insulating layer 12.

A plurality of semiconductor chips 18a and 18b are provided on the substrate 15. The plurality of semiconductor chips 18a and 18b are fixed to the substrate 15 with a solder 16. The rear surfaces of the semiconductor chips 18a and 18b are soldered to the circuit pattern 14.

Types of the semiconductor chips 18a and 18b are not limited. The semiconductor chip 18a is, for example, a transistor chip such as an IGBT (Insulated Gate Bipolar Transistor). Moreover, the semiconductor chip 18b is, for example, a diode chip. The semiconductor device 100 may constitute a three-phase inverter circuit. In this case, six transistor chips and six diodes which are in reverse connection to those are provided in the semiconductor device 100.

A relay substrate 20 is provided on the plurality of semiconductor chips 18a and 18b. The relay substrate 20 has an insulating plate 21, an upper conductor 22 provided on the upper surface of the insulating plate 21, and a lower conductor 23 provided on the lower surface of the insulating plate 21. The insulating plate 21 is formed, for example, of glass epoxy. A through hole 24 is formed in the insulating plate 21.

The lower conductor 23 has a first lower conductor 23a and a second lower conductor 23b. Each of the first lower conductor 23a and the second lower conductor 23b is electrically connected to any of the plurality of semiconductor chips 18a and 18b. In the present embodiment, the first lower conductor 23a is joined to the upper surfaces of the semiconductor chips 18a and 18b with solder. The thickness of the first lower conductor 23a is, for example, not less than 0.2 mm.

When the semiconductor chip 18a is an IGBT, an emitter electrode and a gate electrode are formed on its upper surface. In this case, for example, a solder 19a may join the emitter electrode and the lower conductor 23 together, and a solder 19b may join the gate electrode and the lower conductor 23 together.

The relay substrate 20 has a connection part 25 provided in the through hole 24. The connection part 25 electrically connects the second lower conductor 23b and the upper conductor 22 together. The upper conductor 22, the lower conductor 23 and the connection part 25 are formed of conductors. The second lower conductor 23b is joined to the circuit pattern 14 with a solder 19c. In other words, the upper conductor 22 is electrically connected to the rear surfaces of the semiconductor chips 18a and 18b via the connection part 25, the second lower conductor 23b, the solder 19c, the circuit pattern 14 and the solder 16. A collector electrode is formed on the rear surface of the semiconductor chip 18a.

The solders 16, 19a, 19b and 19c may be replaced by another conductive metal. When the solders 16, 19a, 19b and 19c are replaced by Ag for sintering joining, heat dissipation performance and reliability of power cycles and the like can be improved as compared with soldering.

The lower conductor 23 has protruding parts 23c and 23d protruding outward from the insulating plate 21 in plan view. The protruding part 23d is a part of the first lower conductor 23a.

The semiconductor device 100 includes a first external electrode 31, a second external electrode 32 and a third external electrode 33. When the semiconductor device 100 forms an electric power conversion apparatus, the first external electrode 31 and the second external electrode 32 may be main electrode terminals connected to the collector and the emitter of an IGBT. Moreover, the third external electrode 33 may be a signal terminal connected to the gate thereof.

The protruding part 23d is electrically connected to the first external electrode 31. The upper surface of the protruding part 23d and the first external electrode 31 are joined together with solder or the like. The protruding part 23c is electrically connected to the third external electrode 33. The upper surface of the protruding part 23c and the third external electrode 33 are joined together with solder or the like. The upper conductor 22 is electrically connected to the second external electrode 32. The upper surface of the upper conductor 22 and the second external electrode 32 are joined together with solder or the like.

The plurality of semiconductor chips 18a and 18b and the relay substrate 20 are enclosed by a casing 50. Parts of the first external electrode 31, the second external electrode 32 and the third external electrode 33 are inserted into the casing 50. The interior of the casing 50 is filled with a resin 40. The resin 40 is, for example, epoxy resin. The resin 40 covers the insulating plate 21, the upper conductor 22, the lower conductor 23 and the plurality of semiconductor chips 18a and 18b.

Figure 3:
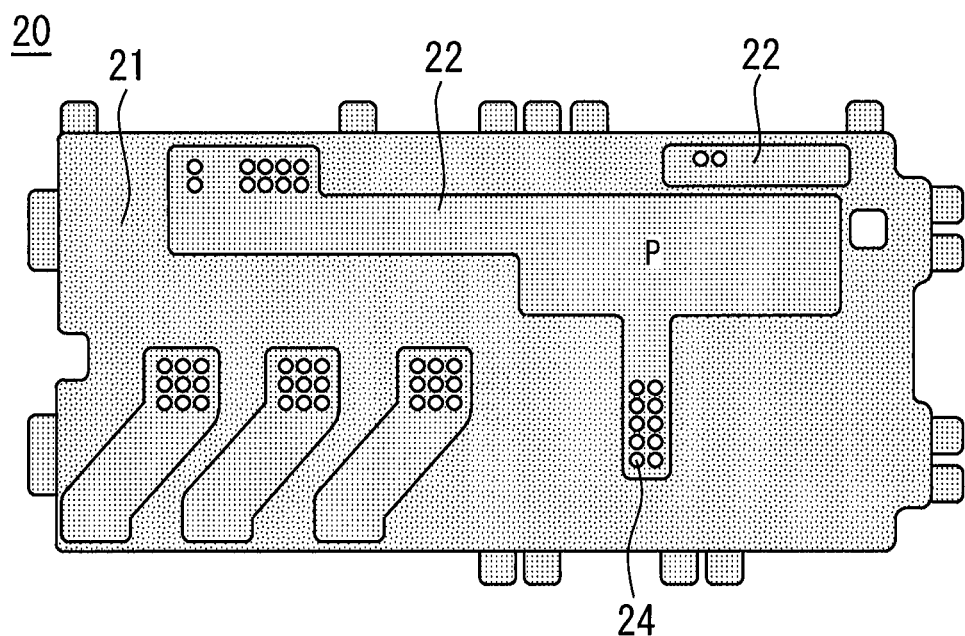
FIG. 3 is a plan view of a relay substrate according to the first embodiment.

FIG. 3 is a plan view of the relay substrate 20 according to the first embodiment. The upper conductor 22 is positioned inside the insulating plate 21 in plan view. In other words, the whole upper conductor 22 is inward of the end part of the insulating plate 21. "P" presented on the upper conductor 22 indicates that the upper conductor 22 is used as a P-phase pattern in an electric power conversion apparatus. A plurality of upper conductors 22 are formed on the upper surface of the insulating plate 21. Through holes 24 are formed in portions, of the insulating plate 21, in which the upper conductors 22 are provided. Copper platings or the like are formed in the through holes 24. By the copper platings, electricity is conducted between the upper conductor 22 and the second lower conductor 23b.

In general, a copper plating has approximately 35 μm of thickness. Copper inlays or the like may be press-fitted into the through holes 24 in order to enhance current density. Thereby, it is possible to make the sectional area of a conductor connecting the upper conductor 22 and the second lower conductor 23b large. Accordingly, more current can be caused to flow therein in this case.

Figure 4:
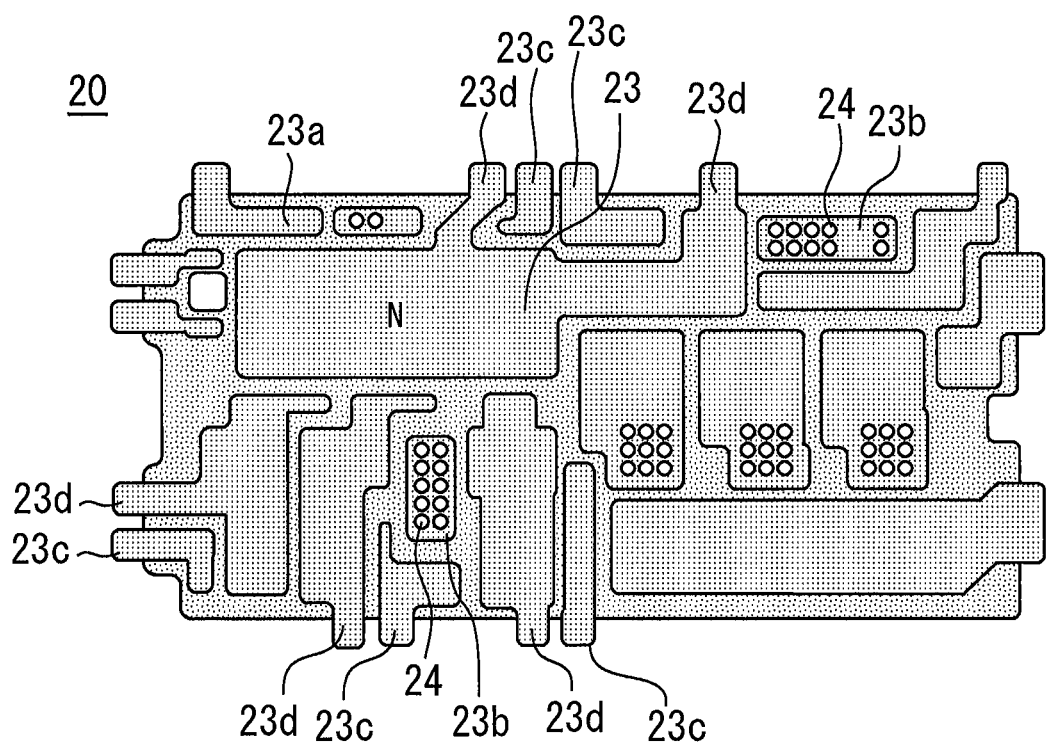
FIG. 4 is a bottom view of the relay substrate according to the first embodiment.

FIG. 4 is a bottom view of the relay substrate 20 according to the first embodiment. The protruding parts 23c and 23d provided in the lower conductor 23 extend outward from the insulating plate 21 in plan view. "N" presented on the first lower conductor 23a indicates that the first lower conductor 23a is used as an N-phase pattern in the electric power conversion apparatus. A plurality of lower conductors 23 are formed.

FIG. 5 is a view having the positions of the upper conductors 22 superimposed on the bottom view of the relay substrate 20 according to the first embodiment. In FIG. 5, the outlines of the upper conductors 22 are indicated by broken lines. The hatched part is a region 80 in which the first lower conductor 23a and the upper conductor 22 overlap with each other in plan view. Consider now a case where the semiconductor chips 18a and 18b contains a transistor chip. In this case, one of the first lower conductor 23a and the upper conductor 22 is electrically connected to the collector of any of the plurality of semiconductor chips 18a and 18b, and the other is electrically connected to the emitter thereof.

In this state, a collector current flows through the one of the first lower conductor 23a and the upper conductor 22, and an emitter current flows through the other. In the present embodiment, the collector current and the emitter current flow in the opposite directions in the region 80 in which the first lower conductor 23a and the upper conductor 22 overlap with each other. Thereby, there can be reduced an internal inductance of the semiconductor device 100.

Moreover, in the present embodiment, as illustrated in FIGS. 1 and 2, the first external electrode 31 and the second external electrode 32 respectively connected to the collector and the emitter are drawn out from the same side of the relay substrate 20. Here, the first external electrode 31 is fixed to the protruding part 23d, and the second external electrode 32 is fixed to a portion, of the upper conductor 22, inward of the end part of the insulating plate 21 in plan view. According to this structure, a certain distance can be secured between the first external electrode 31 and the second external electrode 32 which are different in potential. Accordingly, reliability can be improved.

In the semiconductor device 100 according to the first embodiment, conductors are formed on the upper surface and the lower surface of the relay substrate 20. These conductors enable a three-dimensional wiring with wirings displaced in the thickness direction of the relay substrate 20. Flexibility of wiring can be therefore more improved than in the case where the external electrodes are directly fixed to the semiconductor chips 18a and 18b. Accordingly, the semiconductor device 100 can be downsized.

Moreover, in the semiconductor device 100 of the present embodiment, connection with wires is not employed. Moreover, in the present embodiment, the P-phase and the N-phase can undergo parallel wirings. Thereby, an inductance can be reduced in the package.

Moreover, since aluminum wires or the like are not used for internal wirings of the semiconductor device 100, reliability of joining can be improved. Furthermore, in the present embodiment, the relay substrate 20 is provided between the external electrodes and the semiconductor chips 18a and 18b. Therefore, stress is not directly exerted on the semiconductor chips 18a and 18b and the solders in contact with the semiconductor chips 18a and 18b, the stress exerted on the external electrodes in deformation of the casing 50 or in joining of the external electrodes. Accordingly, reliability of joining can be further improved. Moreover, it is not needed to reduce the lengths of the external electrodes such that large force is not exerted on the solders. Therefore, flexibility in shape of the external electrodes can be improved.

Moreover, in the present embodiment, it is sufficient to fix the external electrodes to the relay substrate 20. Therefore, it is not needed to solder the external electrodes to places with narrow areas, such as signal pads of the semiconductor chips 18a and 18b. Accordingly, the semiconductor device 100 can be easily assembled. Moreover, it is not needed to increase the sizes of the semiconductor chips 18a and 18b in order to increase the areas of the signal pads.

Furthermore, in the present embodiment, the protruding parts 23c and 23d are provided only in the lower conductors 23, not in the upper conductors 22. Thereby, router processing or V-cutting processing can be more easily performed from both sides of the relay substrate 20 than in the case of a structure in which protruding parts are provided on both surfaces of a relay substrate. Accordingly, the semiconductor device 100 can be easily manufactured. Moreover, processing costs of the relay substrate 20 can be suppressed.

The semiconductor device 100 according to the present embodiment can be modified in various ways without its features impaired. As a modification of the present embodiment, the semiconductor chips 18a and 18b may be formed of wide bandgap semiconductor. The wide bandgap semiconductor is, for example, silicon carbide, a gallium nitride-based material or diamond. The semiconductor chip 18a may be a switching device operating with high frequency waves, such as a SiC-MOSFET (Metal-Oxide-Semiconductor Field-Effect Transistor). In this case, ringing and the like can be suppressed in switching, which enables the device to operate at full performance.

Moreover, as to the conductors and the external electrodes provided on the relay substrate 20, a signal circuit part in which a small current flows and a main circuit part in which a large current flows at tens of amperes or more are preferably formed of different materials. For example, conductors and external electrodes for signals can be formed of a brass-based material, and conductors and external electrodes for the main circuit can be formed of a pure copper-based material.

In the first embodiment, the first lower conductor 23a and the second lower conductor 23b are electrically connected to the collectors or the emitters of the transistor chip. In other words, the first lower conductor 23a and the second lower conductor 23b belong to the main circuit part in which a main current flows. These conductors are preferably formed of a material with high electric conductivity, such, for example, as a pure copper-based material.

Moreover, the third external electrode 33 for signals and the first lower conductor 23a and the second lower conductor 23b which are conductors for the main circuit may be formed of different materials. The third external electrode 33 for signals and the first external electrode 31 and the second external electrode 32 for the main circuit may be formed of different materials. Thereby, the third external electrode 33 connecting to the signal circuit part can be prevented from having an overspecification in current capacity, and material costs can be more reduced than in the case where all the conductors and all the external electrodes are composed of a pure copper-based material.

Moreover, as to the conductors formed on the insulating plate 21, conductors for signals may be formed to be thin, and conductors for the main circuit may be formed to be thick. Thereby, the semiconductor device 100 can be downsized.

Moreover, external devices are connected to the first external electrode 31, the second external electrode 32 and the third external electrode 33. Methods for connection to such external devices include soldering and press contact connection such as press-fitting. In accordance with the connection method, there can be selected shapes and materials of the first external electrode 31, the second external electrode 32 and the third external electrode 33. Moreover, the first external electrode 31, the second external electrode 32 and the third external electrode 33 are not directly connected to the semiconductor chips 18a and 18b. Therefore, in the present embodiment, there can be selected shapes and materials of the first external electrode 31, the second external electrode 32 and the third external electrode 33 in no consideration of their joining to the semiconductor chips 18a and 18b. Accordingly, flexibility in shape and material of the external electrodes can be improved.

Notably, the first external electrode 31 may be formed to be thicker than the protruding part 23d, and the third external electrode 33 may be formed to be thicker than the protruding part 23c. Moreover, the second external electrode 32 may be formed to be thicker than the upper conductor 22. Thereby, strength of the external electrodes can be secured.

Moreover, the relay substrate 20 can be modified in various ways as long as a three-dimensional wiring can be realized thereon. For example, the relay substrate 20 may have three or more layers of conductors. Thereby, flexibility of wirings is further improved. In this case, an additional insulating plate is provided on the upper conductor 22, and additional conductors are provided on this insulating plate.

Moreover, a circuit is not limited which is constituted of the plurality of semiconductor chips 18a and 18b. The plurality of semiconductor chips 18a and 18b may constitute, for example, a half bridge circuit. Moreover, in the present embodiment, the protruding parts 23c and 23d are provided in the lower conductor 23. Not limited to this, it is sufficient to provide protruding parts in one of the first lower conductor 23a and the upper conductor 22. Moreover, in the present embodiment, the external electrodes are joined to the upper surfaces of the protruding parts 23c and 23d. Not limited to this, it is sufficient to join external electrodes to the lower surfaces of the protruding parts 23c and 23d. Moreover, the connection method of connecting the first external electrode 31, the second external electrode 32 and the third external electrode 33 to the relay substrate 20 is not limited to soldering, but ultrasonic joining may be employed, for example.

These modifications can be appropriately applied to semiconductor devices and electric power conversion apparatus according to embodiments below. Meanwhile, for the semiconductor devices and the electric power conversion apparatus devices according to the embodiments below, dissimilarities with the first embodiment will mainly be explained as they have many similarities with the first embodiment.

Second Embodiment

FIG. 6 is a plan view of a relay substrate 220 according to a second embodiment. In the relay substrate 220, the upper conductor 22 is provided on the upper surface of the insulating plate 221, and the lower conductor 23 is provided on the lower surface thereof. Notches 221a are formed on the end part of the insulating plate 221 to expose the first lower conductor 23a. In FIG. 6, the protruding parts 23c and 23d are exposed from the insulating plate 221 by the notches 221a. The first external electrode 31 is electrically connected to a portion, of the first lower conductor 23a, which is exposed from the notch 221a.

In the present embodiment, the lower conductor 23 is exposed by shaving off the end part of the insulating plate 21. This can attain the effect similar to that in the first embodiment. Moreover, the first lower conductor 23a is provided inward of the end part of the insulating plate 221. Since the lower conductors 23 do not protrude from the insulating plate 21, the relay substrate 220 can be downsized. Moreover, as mentioned later, an implementation area can be secured to be large when components are implemented on the relay substrate 220.

Third Embodiment

Figure 7:
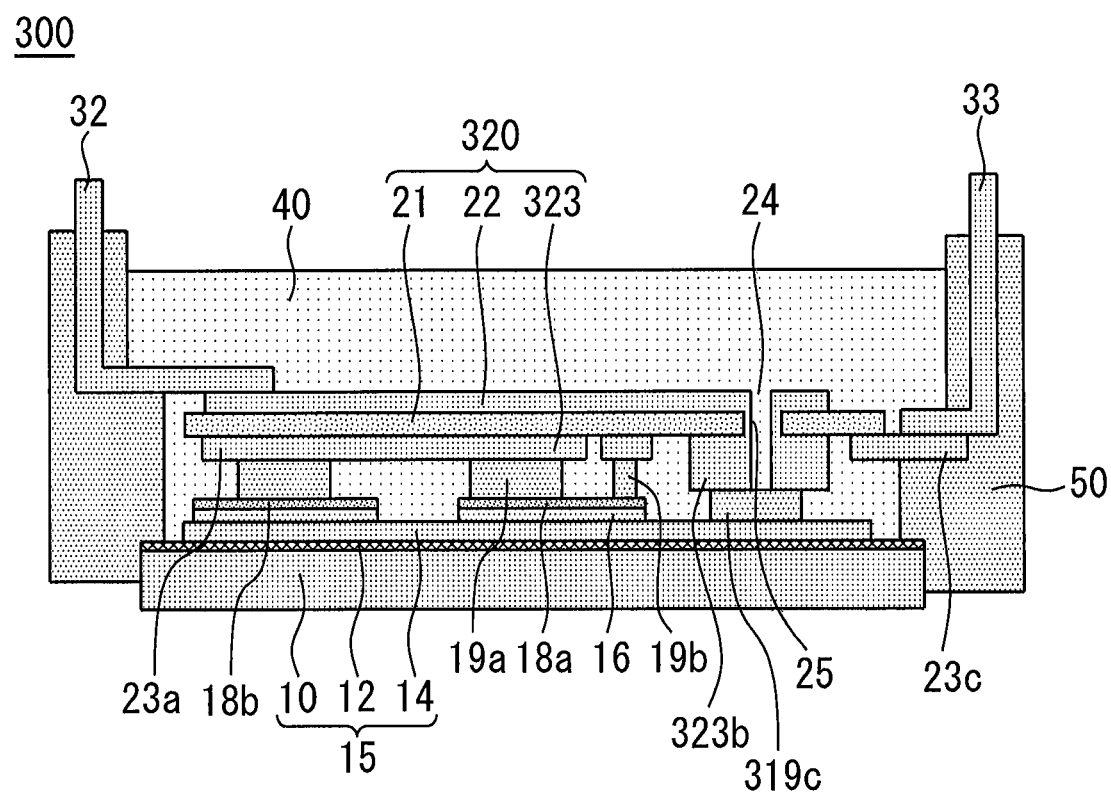
FIG. 7 is a cross-sectional view of a semiconductor device according to a third embodiment.

FIG. 7 is a cross-sectional view of a semiconductor device 300 according to a third embodiment. In the relay substrate 320, a lower conductor 323 is provided to be thicker in a portion in larger distance between a component as a connection target and the insulating plate 21. In FIG. 7, a second lower conductor 323b joined to the substrate 15 is provided to be thicker than the first lower conductor 23a joined to the semiconductor chips 18a and 18b.

For example, when the thicknesses of the plurality of semiconductor chips 18a and 18b are uneven, a solder is formed to be thicker between a thinner semiconductor chip and the relay substrate 20, and a solder is formed to be thinner between a thicker semiconductor chip and the relay substrate 20. In other words, the thicknesses of the solders are not made even, and it is possibly difficult to realize proper solder thicknesses.

On the contrary, in the relay substrate 320 of the present embodiment, the lower conductor 323 is provided to be thicker in a portion in larger distance between a component right below the same and the insulating plate 21. The thickness of the lower conductor 323 is uneven. Thereby, the thicknesses of the solders 19a, 19b and 319c can be made even. Accordingly, the semiconductor device 300 can be easily manufactured.

Fourth Embodiment

Figure 8:
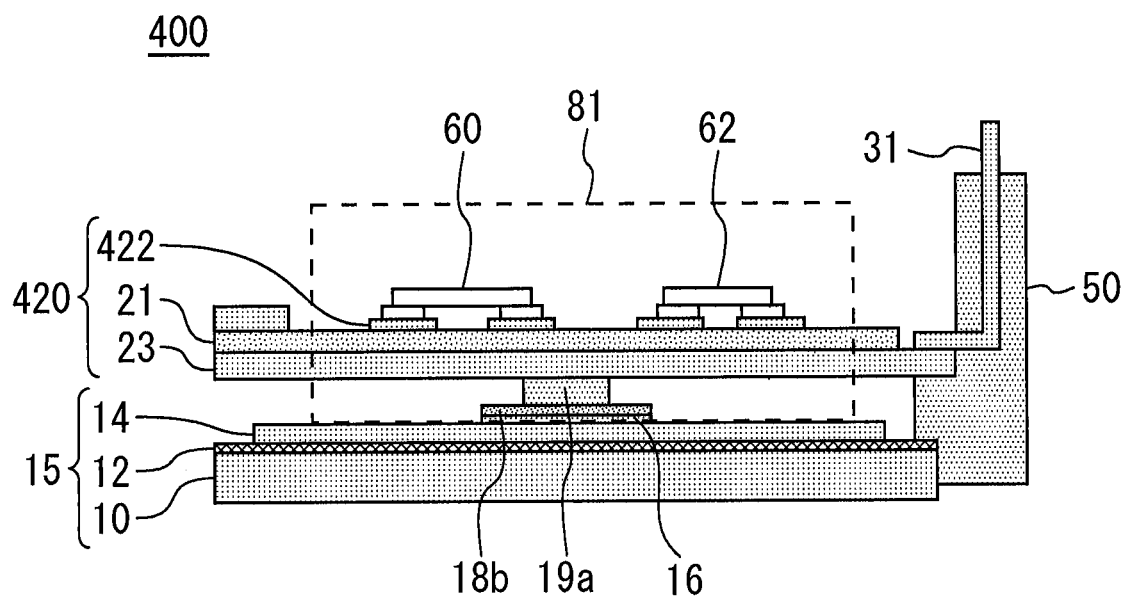
FIG. 8 is a cross-sectional view of a semiconductor device according to a fourth embodiment.

FIG. 8 is a cross-sectional view of a semiconductor device 400 according to a fourth embodiment. On a relay substrate 420, an active component 62 or a passive component 60 is provided. The active component 62 or the passive component 60 is electrically connected to an upper conductor 422. The passive component 60 is, for example, a resistor or a capacitor. The active component 62 is, for example, a control IC or the like. The active component 62 and the passive component 60 serve to perform a protection function for the semiconductor chips 18a and 18b or the semiconductor device 400.

In general, when components to be provided outside the semiconductor device 100 are provided on the relay substrate 420 as the active component 62 and the passive component 60, a function and reliability of the semiconductor device 100 can be thereby improved. As a modification of the present embodiment, the active component 62 and the passive component 60 may be electrically connected to the lower conductor 23. Thereby, the distance between a protection circuit and the semiconductor chips 18a and 18b can be reduced, and accuracy of the protection function can be improved.

Moreover, a portion, of the lower conductor 23 or the upper conductor 422, which is joined to the active component 62 or the passive component 60 may be provided to be thinner than portions, of the semiconductor chips 18a and 18b, in which a main current flows. In the present embodiment, a portion, of the upper conductor 422, on which the active component 62 and the passive component 60 are provided is formed to be thinner than the rest thereof. The thickness of the conductor is, for example, not more than 0.1 mm at places of implementing the active component 62 and the passive component 60. In this way, a pattern can be made fine for a drive circuit or the like of the semiconductor chips 18a and 18b, and the density of implementation can be improved. Moreover, the semiconductor device 400 can be downsized.

Fifth Embodiment

Figure 9:
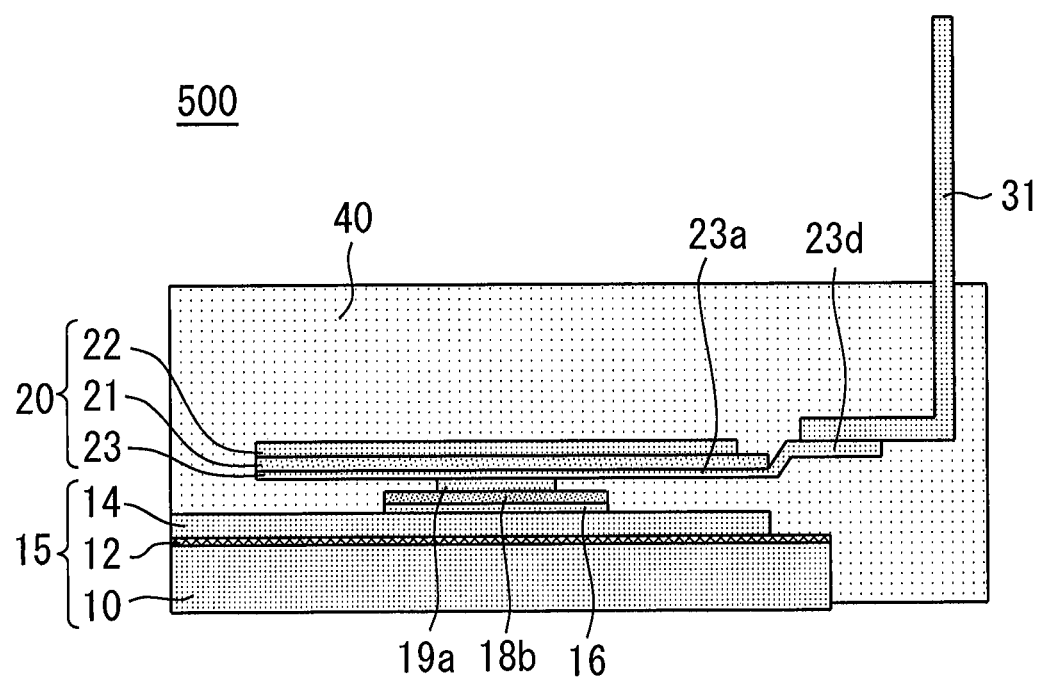
FIG. 9 is a cross-sectional view of a semiconductor device according to a fifth embodiment.

FIG. 9 is a cross-sectional view of a semiconductor device 500 according to a fifth embodiment. The semiconductor device 500 does not include the casing 50. The semiconductor device 500 is formed by sealing a semifinished article which is obtained by integrally assembling the substrate 15, the semiconductor chips 18a and 18b, the relay substrate 20 and the external electrodes with the resin 40 not using a casing. A die is used as an outer frame in the sealing with the resin 40.

In general, the gap between the substrate 15 and the relay substrate 20 is approximately the same as the thickness of the semiconductor chips 18a and 18b, that is, very narrow. The thickness of the semiconductor chips 18a and 18b is, for example, 100 μm. Therefore, it is needed to fill a very narrow region between the substrate 15 and the relay substrate 20 with resin. Conventionally, a liquid epoxy resin material has been occasionally caused to contain a low stress agent or the like. Nevertheless, since such a low stress agent increases the viscosity of the resin and decreases workability in injecting the resin, the content of the low stress agent or the like has been occasionally reduced.

In the present embodiment, the resin is injected into the die at a low pressure with approximately 10 to 15 MPa of injection pressure under a vacuum environment. Thereby, the very narrow region between the substrate 15 and the relay substrate 20 can be filled with the resin. Even when employing resin containing a low stress agent, such a low pressure in injecting the resin into the die enables the resin to be fed into the die thoroughly in every corner thereof. Moreover, the low stress agent contained in the resin can reduce stress arising on the solders, the semiconductor chips 18a and 18b and the like, which can enhance reliability of the semiconductor device 500.

Moreover, the die can finish the appearance of the semiconductor device 500 without a casing. Therefore, costs can be reduced. When the semiconductor device 500 is configured without a casing, the resin 40 is exposed on the lateral surface of the semiconductor device.

Sixth Embodiment

In the present embodiment, any of the aforementioned semiconductor devices according to the first to fifth embodiments is applied to an electric power conversion apparatus. The present embodiment is not limited to a specific electric power conversion apparatus but includes, as described below as a sixth embodiment, a case where any of the semiconductor devices according to the first to fifth embodiments is applied to a three-phase inverter.

Figure 10:
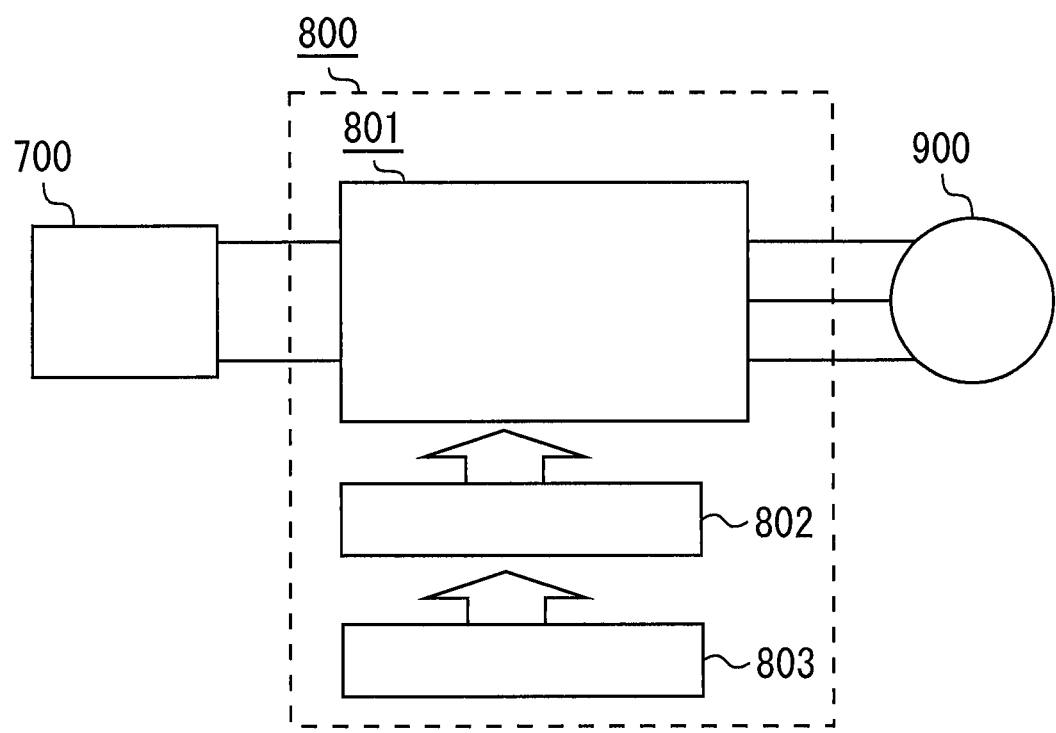
FIG. 10 is a block diagram illustrating a configuration of an electric power conversion system to which an electric power conversion apparatus according to a sixth embodiment is applied.

FIG. 10 is a block diagram illustrating a configuration of an electric power conversion system to which an electric power conversion apparatus 800 according to the present embodiment is applied.

The electric power conversion system illustrated in FIG. 10 is constituted of a power supply 700, the electric power conversion apparatus 800 and a load 900. The power supply 700 is a DC power supply and supplies DC electric power to the electric power conversion apparatus 800. The power supply 700 can be constituted of various components, and can be constituted, for example, of a DC system, solar cells and storage batteries. Moreover, the power supply 700 may be constituted of a rectifier circuit or an AC/DC converter connected to an AC system. Otherwise, the power supply 700 may be constituted of a DC/DC converter which converts DC electric power output from a DC system into predetermined electric power.

The electric power conversion apparatus 800 is a three-phase inverter connected between the power supply 700 and the load 900. The electric power conversion apparatus 800 converts DC electric power supplied from the power supply 700 into AC electric power and supplies the AC electric power to the load 900. As illustrated in FIG. 10, the electric power conversion apparatus 800 includes a main converter circuit 801, a drive circuit 802 and a control circuit 803. The main converter circuit 801 converts DC electric power into AC electric power and outputs it. The drive circuit 802 outputs drive signals for driving switching devices of the main converter circuit 801. The control circuit 803 outputs a control signal for controlling the drive circuit 802 to the drive circuit 802.

The load 900 is a three-phase motor driven by the AC electric power supplied from the electric power conversion apparatus 800. Notably, the load 900 is not limited to a specific use but is any of motors mounted on various electric devices. The load 900 is used, for example, for a motor for a hybrid vehicle, an electric vehicle, a train, an elevator or an air conditioner.

Hereafter, details of the electric power conversion apparatus 800 are described. The main converter circuit 801 includes not-shown switching devices and freewheel diodes. The main converter circuit 801 converts DC electric power supplied from the power supply 700 into AC electric power by switching of the switching devices, and supplies the AC electric power to the load 900. The main converter circuit 801 can employ any of various specific circuit configurations, and the main converter circuit 801 according to the present embodiment is a two-level three-phase full bridge circuit. Such a two-level three-phase full bridge circuit can be constituted of six switching devices and six freewheel diodes which are in anti-parallel to the individual switching devices. To the plurality of switching devices of the main converter circuit 801, the semiconductor device according to any of the aforementioned first to fifth embodiments is applied. Every two switching devices of the six switching devices are connected in series and constitute upper and lower arms. Each pair of the upper and lower arms constitute a phase (a U-phase, a V-phase or a W-phase) of the full bridge circuit. Further, output terminals of the individual upper and lower arms, that is, three output terminals of the main converter circuit 801 are connected to the load 900.

The drive circuit 802 generates drive signals for driving the switching devices of the main converter circuit 801 and supplies them to control electrodes of the switching devices of the main converter circuit 801. Specifically, the drive circuit 802 outputs drive signals for bringing switching devices into ON states and drive signals for bringing switching device into OFF states to the control electrodes of the switching devices in accordance with a control signal from the control circuit 803 mentioned later. When the switching device is maintained in the ON state, the drive signal is an ON signal which is a voltage signal not less than the threshold voltage of the switching device. When the switching device is maintained in the OFF state, the drive signal is an OFF signal which is a voltage signal not more than the threshold voltage of the switching device.

The control circuit 803 controls the switching devices of the main converter circuit 801 such that desired electric power is supplied to the load 900. Specifically, the control circuit 803 calculates an ON time which is a time period for which each switching device of the main converter circuit 801 has to be in the ON state on the basis of the electric power to be supplied to the load 900. For example, the main converter circuit 801 can be controlled by PWM control in which the ON time of the switching devices is modulated in accordance with a voltage to be output. The control circuit 803 outputs a control signal which is a control instruction to the drive circuit 802 such that the ON signals are output to the switching devices to be brought into the ON states and the OFF signals are output to the switching devices to be brought into the OFF states at each time point. In accordance with the control signal, the drive circuit 802 outputs the ON signal or the OFF signal to the control electrode of each switching device as a drive signal.

Since to the electric power conversion apparatus 800 according to the present embodiment, the semiconductor devices according to the first to fifth embodiments are applied as the switching devices of the main converter circuit 801, the electric power conversion apparatus 800 can be easily manufactured.

While for the present embodiment, there has been exemplarily described an example in which the first to fifth embodiments are applied to the two-level three-phase inverter, the present embodiment is not limited to this but they can be applied to various electric power conversion apparatuses. The two-level electric power conversion apparatus in the present embodiment may be replaced by a three-level or multi-level electric power conversion apparatus. Moreover, when electric power is supplied to a single-phase load, the first to fifth embodiments may be applied to a single-phase inverter. Moreover, when electric power is supplied to a DC load, the first to fifth embodiments can be applied to a DC/DC converter or an AC/DC converter.

Moreover, for the electric power conversion apparatus 800 to which the first to fifth embodiments are applied, the load 900 is not limited to a motor. Therefore, it can also be used, for example, as a power supply device of an electric discharge machine, a laser beam machine, an induction heating cooker or a wireless power feed system. Furthermore, the electric power conversion apparatus 800 can also be used as a power conditioner of a solar power generation system, a power storage system, or the like.

The technical features described in the foregoing embodiments can be used in various combinations as required.

In a semiconductor device according to the present invention, a protruding part protruding outward from the insulating plate is provided in one of the first lower conductor and the upper conductor, and it is not provided in the other. Therefore, the relay substrate can be easily processed. Accordingly, the semiconductor device can be easily manufactured.

In a semiconductor device according to the present invention, a notch which exposes the first lower conductor is formed on the end part of the insulating plate. Therefore, it is not needed to provide a protruding part to which the external electrode is connected, and the relay substrate can be easily processed. Accordingly, the semiconductor device can be easily manufactured.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2018-166813, filed on Sep. 6, 2018 including specification, claims, drawings and summary, on which the Convention priority of the present application is based, are incorporated herein by reference in its entirety.

The invention claimed is:

1. A semiconductor device comprising:
 a substrate;
 a plurality of semiconductor chips provided on the substrate;
 a relay substrate provided on the plurality of semiconductor chips;
 a first external electrode; and
 a second external electrode, wherein
 the relay substrate includes
 an insulating plate in which a through hole is formed,
 a lower conductor provided on a lower surface of the insulating plate and having a first lower conductor electrically connected to any of the plurality of semiconductor chips and a second lower conductor electrically connected to any of the plurality of semiconductor chips,
 an upper conductor provided on an upper surface of the insulating plate,
 a connection part provided in the through hole and electrically connecting the second lower conductor and the upper conductor together, and
 a protruding part which is a part of one of the first lower conductor and the upper conductor and protrudes outward from the insulating plate in plan view,
 the protruding part is electrically connected to the first external electrode, and
 the other of the first lower conductor and the upper conductor is electrically connected to the second external electrode and is positioned inside the insulating plate in plan view.

2. The semiconductor device according to claim 1, wherein the protruding part is provided in the first lower conductor.

3. The semiconductor device according to claim 1, wherein in the relay substrate, the lower conductor is provided to be thicker in a portion in larger distance between a component as a connection target and the insulating plate.

4. The semiconductor device according to claim 1, wherein currents in the lower conductor and the upper conductor flow in opposite directions.

5. The semiconductor device according to claim 1, wherein
 one of the first lower conductor and the upper conductor is electrically connected to a collector of any of the plurality of semiconductor chips, and
 the other of the first lower conductor and the upper conductor is electrically connected to an emitter of any of the plurality of semiconductor chips.

6. The semiconductor device according to claim 1, wherein
 an active component or a passive component is provided on the relay substrate, and
 a portion, of the lower conductor or the upper conductor, which is joined to the active component or the passive component is provided to be thinner than a portion, of the lower conductor or the upper conductor, in which a main current of the semiconductor chips flows.

7. The semiconductor device according to claim 1, wherein the semiconductor chips is formed of wide bandgap semiconductor.

8. The semiconductor device according to claim 7, wherein the wide bandgap semiconductor is silicon carbide, a gallium nitride-based material or diamond.

* * * * *